(12) United States Patent  
Kraehmer et al.

(10) Patent No.: US 7,483,121 B2  
(45) Date of Patent: *Jan. 27, 2009

(54) MICROLITHOGRAPH SYSTEM

(75) Inventors: Daniel Kraehmer, Essingen (DE); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/949,981

(22) Filed: Dec. 4, 2007

(65) Prior Publication Data

US 2008/0088816 A1   Apr. 17, 2008

Related U.S. Application Data

(63) Continuation of application No. 10/997,455, filed on Nov. 24, 2004, now Pat. No. 7,317,508.

(30) Foreign Application Priority Data

Nov. 28, 2003   (DE) ............................... 103 55 725

(51) Int. Cl.  
G03B 27/52 (2006.01)  
G03B 27/72 (2006.01)  
G02F 1/01 (2006.01)  
G02B 27/28 (2006.01)

(52) U.S. Cl. ..................... 355/55; 355/71; 250/330; 359/494

(58) Field of Classification Search ............... 355/55, 355/53, 67, 71; 250/330; 349/120; 359/494  
See application file for complete search history.

(56) References Cited

U.S. PATENT DOCUMENTS

| 5,986,733 | A  | 11/1999 | Winker et al. |
| 6,785,051 | B2 | 8/2004  | Allan et al.  |
| 2003/0011896 | A1 | 1/2003 | Shiraishi |
| 2003/0168597 | A1 | 9/2003 | Webb et al. |
| 2004/0105170 | A1 | 6/2004 | Krahmer et al. |

FOREIGN PATENT DOCUMENTS

| WO | WO 02/093209 | 11/2002 |
| WO | WO 02/099500 | 12/2002 |
| WO | WO 03/046634 | 5/2003 |

Primary Examiner—Peter B Kim  
(74) Attorney, Agent, or Firm—Fish & Richardson P.C.

(57) ABSTRACT

An optical system of a microlithographic exposure apparatus comprises at least one optical element (L1 to L16, 15, 16, 24) having a locally varying birefringence direction distribution that is caused by stress-induced birefringence and is at least substantially rotationally symmetrical. At least one birefringent correcting element (K1, K2; K') is made of a crystal having a location independent birefringence direction distribution that is at least substantially rotationally symmetrical. The crystal has a crystal lattice orientation that is oriented such that its birefringence direction distribution is at least substantially perpendicular to the locally varying birefringence direction distribution of the at least one optical element (L1 to L16, 15, 16, 24).

28 Claims, 4 Drawing Sheets

MICROLITHOGRAPH SYSTEM

CROSS-REFERENCE TO RELATED APPLICATIONS

This application is a continuation application of U.S. patent application Ser. No. 10/997,455, filed Nov. 24, 2004, which claims priority of German Patent Application DE 103 55 725, filed Nov. 28, 2003. The full disclosure of these applications are incorporated herein by reference.

BACKGROUND OF THE INVENTION

1. Field of the Invention

The invention relates to an optical system of a microlithographic projection exposure system having at least one refractive optical element having stress-induced birefringence.

2. Description of Related Art

Birefringent optical materials have the property that the refractive index is anisotropic. As a result, the refractive index is dependent on the polarization of a transiting light beam and its orientation relative to the material. Because of this, a birefringent material usually splits a beam of unpolarized light into two beams having orthogonal linear polarization directions.

There may be different causes for birefringence in optical materials. Crystals belonging to the hexagonal, tetragonal or trigonal crystal systems have their atoms arranged so that light propagating in some general direction will encounter an asymmetric structure. A direction about which the atoms are arranged symmetrically is usually referred to as optic axis or as birefringence axis. In order to avoid any confusion with the optical axis denoting an axis of symmetry of a lens system, the term birefringence axis will be used hereinafter. Uniaxial crystals such as $MgF_2$ or crystalline $SiO_2$ have only one birefringence axis. However, also cubic crystals such as $CaF_2$ may be birefringent, at least for a certain wavelength range. In this case the birefringence is usually referred to as intrinsic.

Apart from that, there are also non-crystalline materials which may be optically birefringent. In these cases the birefringence is caused by disturbances of the molecular order in the short-range. Such disturbances may be a result of external mechanical forces, of electrical fields or of magnetic fields. The material often loses its birefringent property when the causes of these disturbances are no longer present. If, for example, a lens mount exerts mechanical forces on a lens which produce stress-induced birefringence, this birefringence will disappear as soon as the lens mount is removed.

In the case of permanent stresses, irreversible stress-induced birefringence may be observed. This situation often occurs in blanks of quartz glass that are used for the manufacture of lenses and other refractive optical elements. The irreversible stress-induced birefringence in these blanks is usually a result of the manufacturing process. The magnitude and orientation of the birefringence then often is at least approximately rotationally symmetrical with respect to an axis of symmetry of the blank. The magnitude of the birefringence generally increases with growing distance from this axis.

In many optical systems, the stress-induced birefringence in the refractive optical elements may, although being significant, be neglected. However, if very severe demands are posed on the imaging properties of the optical system, the effects of stress-induced birefringence cannot be ignored. Examples of such optical systems are the subsystems of microlithographic projection exposure apparatuses, namely the illumination system and the projection lens. Such apparatuses are used to lithographically define the structures of highly integrated electrical circuits and other microstructured components. For this purpose, a reticle is provided containing minute structures to be imaged. These structures are illuminated by the illumination system and imaged—generally to a reduced size—by means of the projection lens on a light-sensitive layer which is deposited to a substrate, e.g. a silicon wafer. If significant birefringence occurs in the projection lens, this leads to an intolerable decrease of the contrast in the image plane of the projection lens unless suitable countermeasures are taken.

By contrast, significant birefringence in the illumination systems makes it difficult to illuminate the reticle with projection light having a defined state of polarization.

The only countermeasure against irreversible stress-induced birefringence known to date is to use blanks whose irreversible stress-induced birefringence is as small as possible. However, such blanks are expensive and often not easily available.

The problem of birefringence has also acquired a particular significance in the case of projection lenses which are designed for shorter wavelengths, e.g. 157 nm. Because of the low transparency of conventional lens materials to deep UV light, calcium fluoride ($CaF_2$) is envisaged as a material because this crystal is still transparent even at very short UV wavelengths. However, as has now been discovered, this material is intrinsically birefringent at such short wavelengths.

In order to reduce the adverse effects of intrinsic birefringence, it has been proposed to select the crystal orientations of a plurality of optical elements made from calcium fluoride in such a way that birefringence direction distributions are obtained that are at least approximately rotationally symmetrical. In certain cases it is even possible to obtain at least a partial mutual compensation of the birefringence (or, to be more precise, of the retardances caused by the intrinsic birefringence) inherent to the individual optical elements. Arrangements of this kind are described in, for example, document WO 02/093209 A2.

However, in the general case it is not possible to achieve a complete compensation of intrinsic birefringence even if the crystal orientations are optimally selected. This is due to the fact that a complete compensation of retardances caused by intrinsic birefringence requires not only a suitable combination of the birefringence distributions, but also matching geometrical path lengths and angles of incidence of the light propagating through the crystals. To avoid any undesired residual retardances, WO 02/099500 A2 proposes an additional correcting element having a defined and carefully determined stress-induced birefringence. This stress-induced birefringence is determined such that retardances caused by intrinsic birefringence in the rest of the system are at least partially compensated for.

WO 03/046634 A1 discloses a method for compensating the birefringence caused by intrinsically birefringent crystals. One of the measures described therein is to cause a stress-induced and rotationally symmetrical birefringence in a non-crystalline material by carefully controlling the temperature during the manufacturing process.

SUMMARY OF THE INVENTION

It is an object of the invention to provide an optical system of a microlithographic exposure apparatus and a method for manufacturing such a system in which adverse effects of stress-induced birefringence are reduced.

This object is achieved by an optical system comprising:

a) at least one optical element having a locally varying birefringence direction distribution that is caused by stress-induced birefringence and is at least substantially rotationally symmetrical; and
b) at least one birefringent correcting element made of a crystal having a location independent birefringence direction distribution that is at least substantially rotationally symmetrical, wherein the crystal has a crystal lattice orientation that is oriented such that its birefringence direction distribution is at least substantially perpendicular to the locally varying birefringence direction distribution of the at least one optical element.

The invention is based on the finding that not only the effect of intrinsic birefringence can be compensated for by stress-induced birefringence but also, conversely, the effect of stress-induced birefringence can be reduced by one or more birefringent correcting elements that have a location independent but rotationally symmetric birefringence direction distribution. Such a distribution may be achieved by at least two intrinsically birefringent correcting elements made of crystals having a fluorite crystal structure such as calcium fluoride ($CaF_2$), barium fluoride ($BaF_2$) or corresponding mixed crystals ($Ca_{1-x}Ba_xF_2$). This is due to the fact that these intrinsically birefringent crystals allow the birefringent properties to be freely determined, within certain limits, by selecting the crystal orientation. A combination of two correcting elements made of such crystals and having carefully selected crystal lattice orientations allows to achieve a rotational symmetrical birefringence direction distribution.

In the case of stress-induced birefringence, the magnitude of the birefringence generally increases the farther a point at which a beam passes through a blank is from the optical axis. This radial dependence is the reason why the stress-induced birefringence is mainly determined by the optical elements in the vicinity of a pupil plane. Since the locally varying birefringence direction distribution in a pupil translates into an angularly varying birefringence direction distribution in a conjugated field plane, the birefringence of an optical element of quartz glass arranged near a pupil plane can be, at least to a large extent, compensated for by two intrinsically birefringent correcting elements arranged near a field plane. The compensating effect of the intrinsic birefringence declines the larger the birefringence contribution of optical elements positioned far away from a pupil plane is, and the further away the correcting elements are arranged from a field plane.

In cases where the birefringence of the blanks is not rotationally symmetrical, the blanks may often be orientated such that the angle dependent birefringence direction distribution, as produced by the optical elements as a whole, is substantially rotationally symmetrical in relation to an optical axis of the optical system.

In the case of fluoride crystals, a rotationally symmetrical birefringence direction distribution can be achieved, for example, by selecting the crystal lattice orientations of two correcting elements in such a way that their [100] crystal axes are aligned substantially parallel to the optical axis and are rotated relative to one another through 45° or an odd-numbered multiple thereof about the optical axis. However, there are also other combinations of crystal orientations of two or even more elements of fluoride crystals that allow to achieve a rotationally symmetrical birefringence direction distribution. In this context reference is made to WO 02/093209 A2, WO 02/099500 and US 2003/0011896 A1, the full disclosure of which being incorporated herein by reference.

By using flat or almost flat intrinsically birefringent correction elements, is it ensured that each light ray passes through the correcting elements under the same angle and travels approximately the same distance within each correction element. This is a condition required for obtaining a combined rotationally symmetrical birefringence direction distribution that is the sum of the distributions of each correction element.

Almost flat in this context means that the surfaces of the at least two intrinsically birefringent correaction elements have normalized curvatures CA/R of less than 1, wherein CA is the clear aperture of the surface and R is the radius of curvature. Preferably, the normalized curvatures are less than 0.7, more preferably less than 0.4 and even more preferably less than 0.2.

To enable retardances due to stress-induced birefringence to be compensated for with as few intrinsically birefringent correcting elements as possible, the correcting elements should be arranged in optical systems at a point along the optical axis where large angles occur. This is because, in the case of the crystal orientations presently concerned, the magnitude of the intrinsic birefringence increases as the aperture angle increases. This means that light rays that are very much inclined to the optical axis suffer most from birefringence. The greater this effect is, the greater can the retardance be which is produced by the optical elements having intrinsic birefringence.

If the optical system is a projection lens of a microlithographic projection exposure apparatus, then the at least one intrinsically birefringent correcting element may form the last optical component(s) of the projection lens. This ensures not only that the at least one correcting element is positioned close to a field plane, but also that large angles occur. The same applies, in principle, if the optical system is an illumination system of a projection exposure apparatus.

As an alternative to intrinsically birefringent crystals, a uniaxial crystal such as $MgF_2$ or $Al_2O_3$ may be used as correction element. If the birefringence axis of a uniaxial crystal is aligned along the optical axis of the optical system, this results in a rotationally symmetric angularly varying birefringence direction distribution. As in the case of a combination of two intrinsically birefringent crystals that are suitably clocked, the magnitude of birefringence increases at least approximately with increasing aperture angles.

Since the birefringence observed in uniaxial crystals is usually much stronger than the intrinsic birefringence in fluoride crystals, very thin (e.g. less than 1000 nm, preferably less than 500 nm, more preferably 250 nm) layers are generally sufficient to achieve a compensating effect. These layers may be deposited on a suitable substrate, for example a plane parallel thin amorphous quartz plate, or the surface of a lens that is already present in the system.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
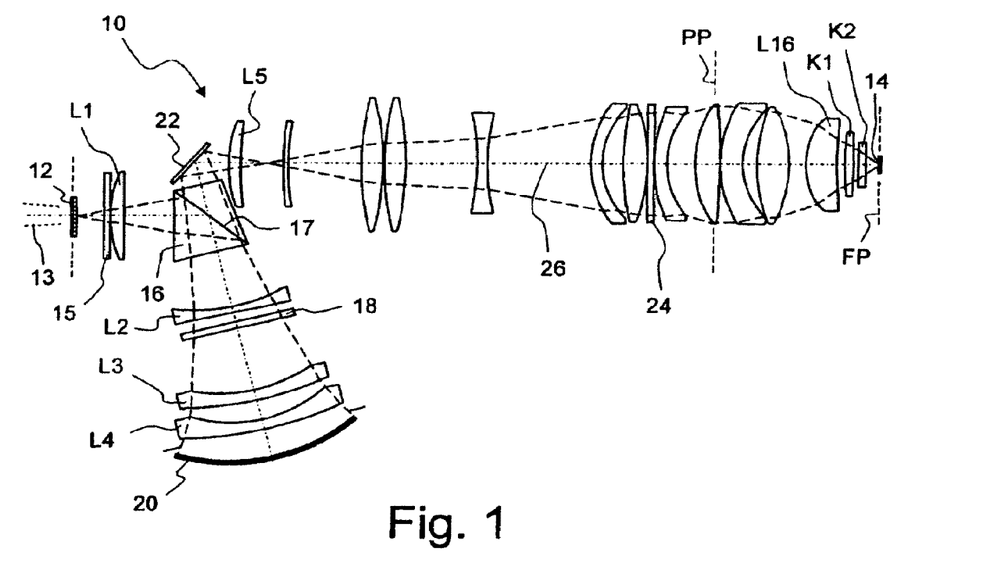
FIG. 1 is a simplified representation showing a meridional section of a catadioptric projection lens of a microlithographic projection exposure apparatus in accordance with the invention.

FIG. 1 shows, in a simplified representation, a meridional section of a projection lens 10 of a microlithographic projection exposure apparatus. The projection lens 10 forms a reduced image of structures, which are contained in a reticle 12, on a light-sensitive layer deposited on a substrate 14. The reticle 12 is arranged in an object plane and the light-sensitive layer in an image plane of the projection lens 10.

Projection light 13, indicated in FIG. 1 by dashed lines, is generated by an illuminating system of the projection exposure apparatus and has, in the embodiment shown, a wavelength $\lambda=193$ nm. After passing through the reticle 12, it propagates via a plane-parallel plate 15 and a lens L1 into a beam-splitting cube 16 that contains a beam-splitting layer 17. In the cube 16 the projection light 13 is reflected at the polarization-selective beam splitting layer and is directed via a lens L2, a quarter-wave plate 18 and two further lenses L3 and L4 onto a spherical mirror 20.

Upon reflection at the spherical mirror 20, the projection light 13 again passes through the lenses L4 and L3, the quarter-wave plate 18 and the lens L2 and impinges on the polarization-selective beam-splitting layer 17. There, however, the beam of projection light is not reflected but transmitted, because the polarization of the beam of projection light has been rotated through 90° as a result of its two passages through the quarter-wave plate 18. From the beam-splitting cube 16, the beam of projection light makes its way via a plane mirror 22 into a purely dioptric part of the projection lens 10. This part contains lenses L5 to L16, which are not indicated separately, a further plane-parallel plate 24 and two correcting elements K1 and K2 arranged along an optical axis 26 of the projection lens 10.

The lenses L1 to L16, the plane-parallel plates 15 and 24 and the beam-splitting cube 16 are made from quartz glass blanks which, though to different degrees, show the effect of stress-induced birefringence. This results in a birefringence direction distribution across the surface of the blank. The term birefringence direction distribution describes in this context the locally varying direction and magnitude of the birefringence $\Delta n$. The term "birefringence direction" denotes direction of the slow birefringence axis.

Figure 2A:
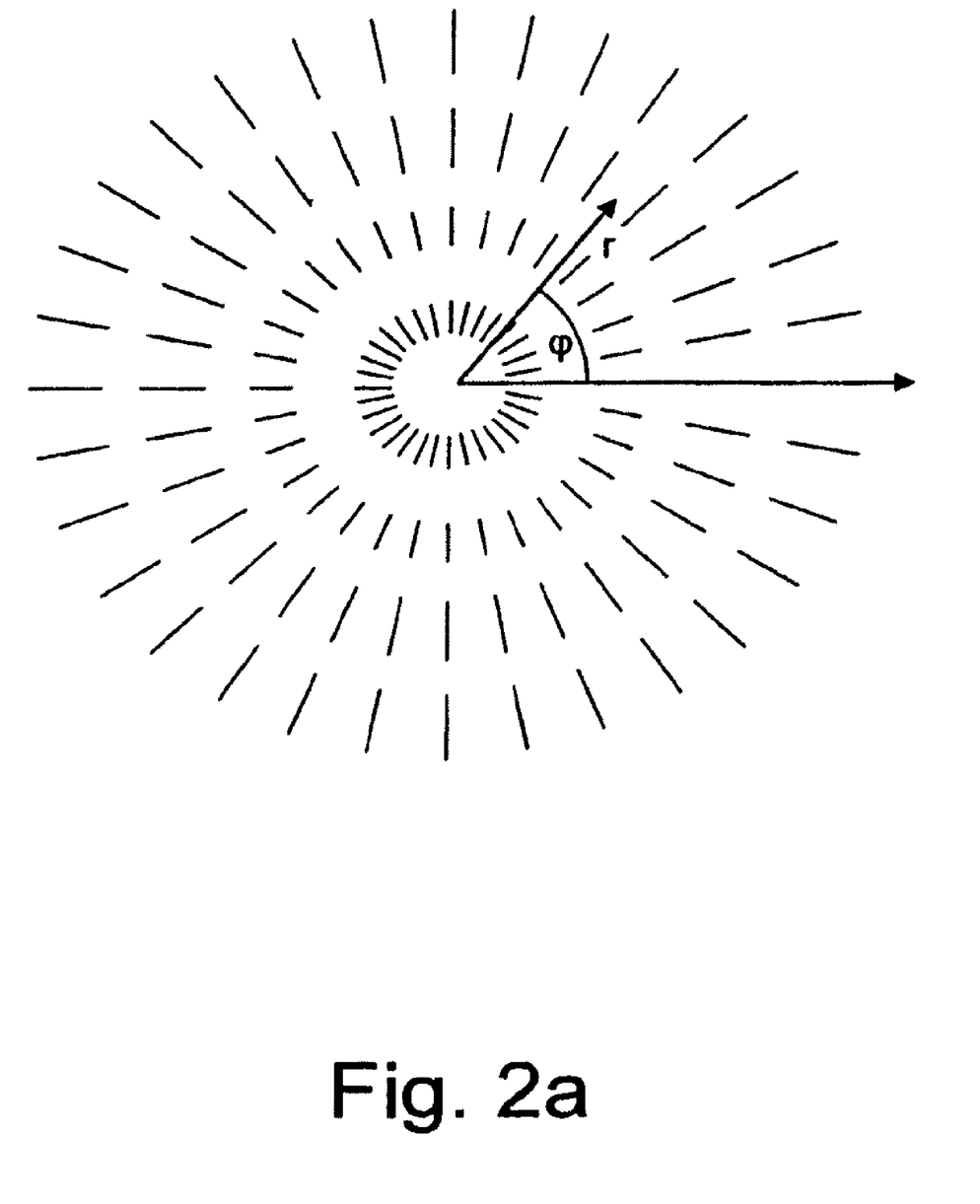
FIG. 2a shows a locally varying birefringence direction distribution which is produced by a single optical element having stress-induced birefringence.

In the case of quartz glass blanks, the birefringence direction distribution depends on the type of manufacturing process and of manufacturing parameters that are usually unknown. Often the blanks have a birefringence direction distribution in which the slow axis of birefringence extends in the radial direction resulting in a rotationally symmetrical birefringence direction distribution. This is shown in FIG. 2a for a single blank. The length of each line in FIG. 2a represents the magnitude $\Delta n$ of the birefringence, whereas the direction of the lines indicates the direction of the slow birefringence axis for a light ray that passes a point given by polar coordinates $(r,\phi)$. The magnitude $\Delta n$ has approximately a radial dependence of $\Delta n \sim r^2$, but is independent of the polar angle $\phi$. Therefore the stress-induced birefringence $\Delta n$ is locally varying but angle independent function.

In a smaller proportion of the blanks, the direction of the slow axis extends perpendicularly thereto, i.e. in a tangential direction, which still results in a rotationally symmetrical birefringence direction distribution.

Figure 2B:
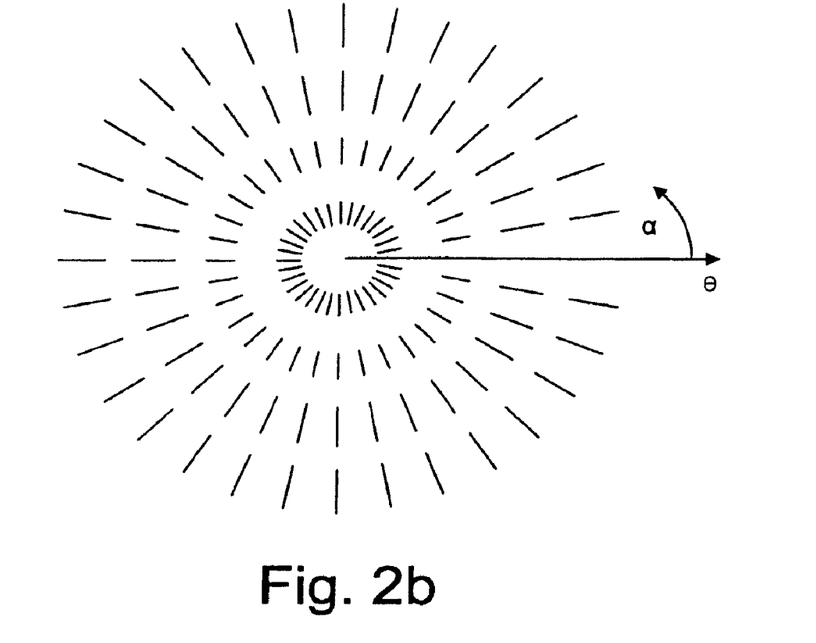
FIG. 2b shows an angle dependent birefringence direction distribution which is produced by the entirety of optical elements having stress-induced birefringence, as it could be measured in the image plane of the projection lens.

FIG. 2b shows, in an idealized form, an angle dependent birefringence direction distribution $\Delta n(\theta,\alpha)$ for the entirety of the refractive optical elements composed of quartz glass, i.e. the lenses L1 to L16, the plane-parallel plates 15 and 24 and the beam-splitting cube 16. Again, the length of each line in FIG. 2b represents the magnitude $\Delta n$ of the birefringence and the direction of the lines indicates the direction of the slow birefringence axis for a light ray. However, the graph of FIG. 2b does not represent a locally varying function but an angle dependent function for the birefringence direction distribution as it could be measured in the image plane FP of the projection lens 10. In FIG. 2b $\theta$ denotes the aperture angle and $\alpha$ the azimuth angle. Since this birefringence direction distribution is only a function of pupil coordinates, it is sometimes also referred to as birefringence pupil distribution.

The angle dependence is caused by the fact that the beam of projection light 13 is widened to its maximum diameter in the region of a pupil plane PP. This means that projection light passes through the optical elements in the vicinity of a pupil plane PP at greater distances from the optical axis. Due to the $\Delta n \sim r^2$ dependence, the optical elements in the vicinity of a pupil plane PP mainly determine the stress-induced birefringence direction distribution. Since locations in a pupil plane PP directly translate into angles in a conjugated field plane (here the image plane FP), the locally varying birefringence direction distribution shown in FIG. 2a is similar to the angle dependent birefringence direction distribution shown in FIG. 2b.

Thus the angle dependent birefringence direction distribution of FIG. 2b also has a rotational symmetry. This particularly implies that, although the magnitude $\Delta n$ of the birefringence depends on the aperture angle $\theta$, it does not depend on the azimuth angle $\alpha$. In the embodiment shown, the magnitude $\Delta n$ of the angle dependent birefringence increases approximately linearly with an increasing aperture angle $\theta$, but may also have a square-law dependence on the aperture angle $\theta$.

Figure 3:
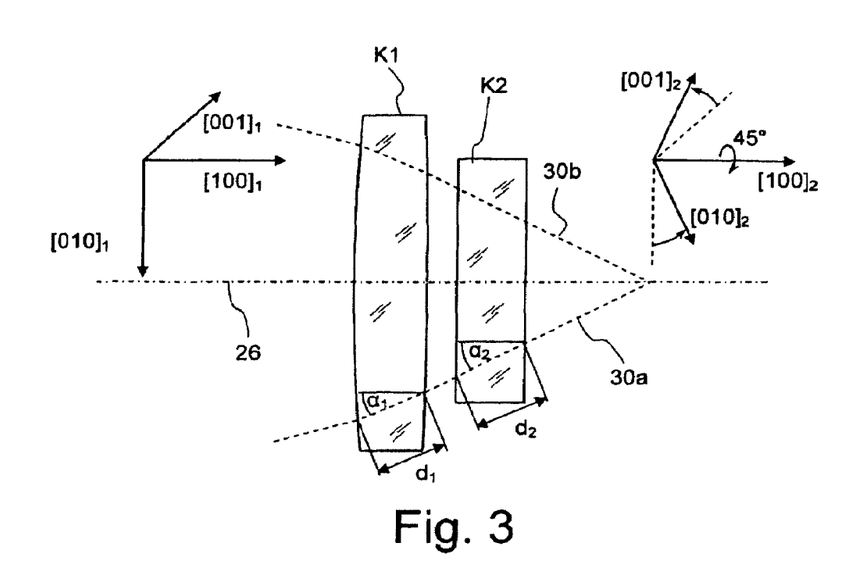
FIG. 3 shows a detail from FIG. 1 in which two correcting elements in accordance with the invention are shown to an enlarged scale with the crystal orientations indicated.

FIG. 3 shows the two correcting elements K1 and K2 in an enlarged view. Correcting element K1 has a small positive refractive power with very small surface curvatures. Correcting element K2 is a plane-parallel terminal plate which is easily replaceable and terminates the projection lens 10 at its image side. The two correcting elements K1 and K2 are made from calcium fluoride crystals whose crystal orientations are indicated in FIG. 3 by tripods. In both cases, the [100] crystal axes are aligned parallel to the optical axis. In addition, the crystal lattices are rotated relative to one another by 45° about the [100] axis. This rotation is often referred to as "clocking".

Figure 4:
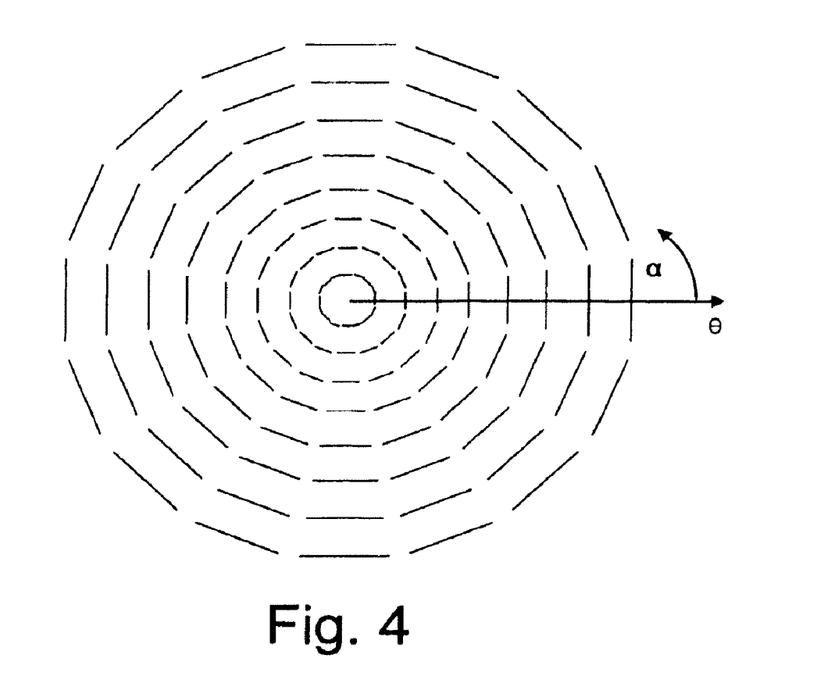
FIG. 4 shows an angle dependent birefringence direction distribution which is produced by the two correcting elements.

As is described in more detail in WO 02/093209 A, such an arrangement of the crystal lattices produces a rotationally symmetrical angle dependent birefringence direction distribution which is shown in FIG. 4 for the combination of the two correcting elements K1 and K2. Compared with FIG. 2b, it can be seen that now the directions of the slow axis are perpendicular to the directions of the slow axis of the entirety of the refractive optical elements composed of quartz glass L1 to L16, 15, 16, 24, which is shown in FIG. 2b. In this way, those polarization components are delayed during the passage through the correction elements K1, K2 that have been traveling faster through the optical elements L1 to L16, 15, 16, 24 due to a lower refractive index. Thus an at least partial compensation for the retardances is achieved which are caused by the stress-induced birefringence of the optical elements L1 to L16, 15, 16, 24 made of quartz glass.

A perfectly rotationally symmetrical birefringence direction distribution in the correcting elements K1 and K2, such as is shown in FIG. 4, can be obtained if, for any arbitrary beam of light, the condition is satisfied that the beam propagates through both correcting elements K1 and K2 at the same angle $\alpha_1$ and $\alpha_2$, respectively, and the distances $d_1$ and $d_2$ traveled in the correcting elements K1 and K2 are the same. In the case of the projection lens 10, this is achieved by virtue of the fact that the correcting element K2 is a plane-parallel plate and the correcting element K1, due to the very slight curvature of its surfaces, can at least approximately be considered to represent a plane-parallel plate of the same thickness.

Since the two correction elements K1, K2 are positioned close to the image plane FP, it is also ensured that the aforementioned relationship between locations on optical elements in the vicinity of a pupil plane PP and angles in a conjugated field plane at least approximately is advantageously exploited.

It goes without saying that the embodiment described above may be modified in a variety of ways. Hence, the invention is not limited to the use in a projection lens but may also be used in the illumination system of a microlithographic exposure apparatus. The invention may further be applied when only a single optical element in the optical system is birefringent due to stresses in the material. The stresses in the material which produce the undesired birefringence in the optical elements may also be generated by mechanical forces which act on the optical elements from lens mountings or the like.

If the optical elements composed of quartz glass have, in their entirety, a birefringence direction distribution in which, in contrast to what is shown in FIG. 2b, the slow birefringence axis is not extending along the radial direction but in the tangential direction, other correcting elements K1 and K2 have to be selected. For example, correcting elements made of $BaF_2$ may be used with crystal lattice orientations as shown in FIG. 3, because the intrinsic birefringence directions in $BaF_2$ are perpendicular to the directions of $CaF_2$ having the same crystal lattice orientation. Alternatively, correcting elements K1, K2 made of $CaF_2$ may be used, but with the [111] crystal axes aligned along the optical axis 26. In this case the crystal lattices have to be rotated through 60° or an odd multiple thereof relative to one another about the optical axis 26.

Figure 5:
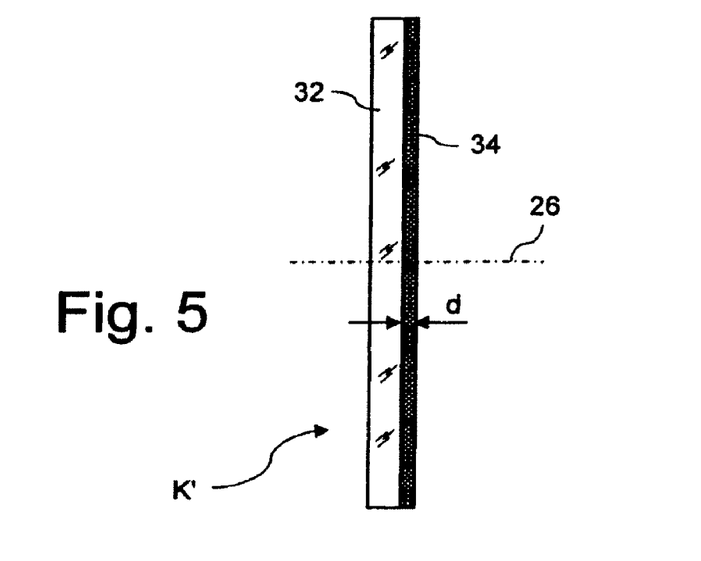
FIG. 5 shows a correction element comprising a substrate and a thin layer of a unixial crystal deposited thereon.

FIG. 5 is a lateral view of a correction element K' according to an alternative embodiment. The correaction element K' comprises a substrate 32 that is made of a plane quartz glass plate having a uniform thickness across its area. On one side of the substrate a thin layer 34 of crystalline $MgF_2$ is grown using conventional vapor deposition techniques as are known as such in the art.

$MgF_2$ is a positively uniaxial crystal having a strong birefringence that depends on the direction of an incident light ray with respect to the birefringence axis of the crystal. In the absence of mechanical stress, there is no dependency on the location where a light ray impinges on the crystal. The crystal lattice of the layer 34 is oriented such that the birefringence axis is aligned along the optical axis 26 of the projection lens 10. Thus a light ray passing the layer 34 parallel to the optical axis 26 does not experience birefringence, whereas all other rays suffer from birefringence depending on the value of the aperture angle.

Figure 6:
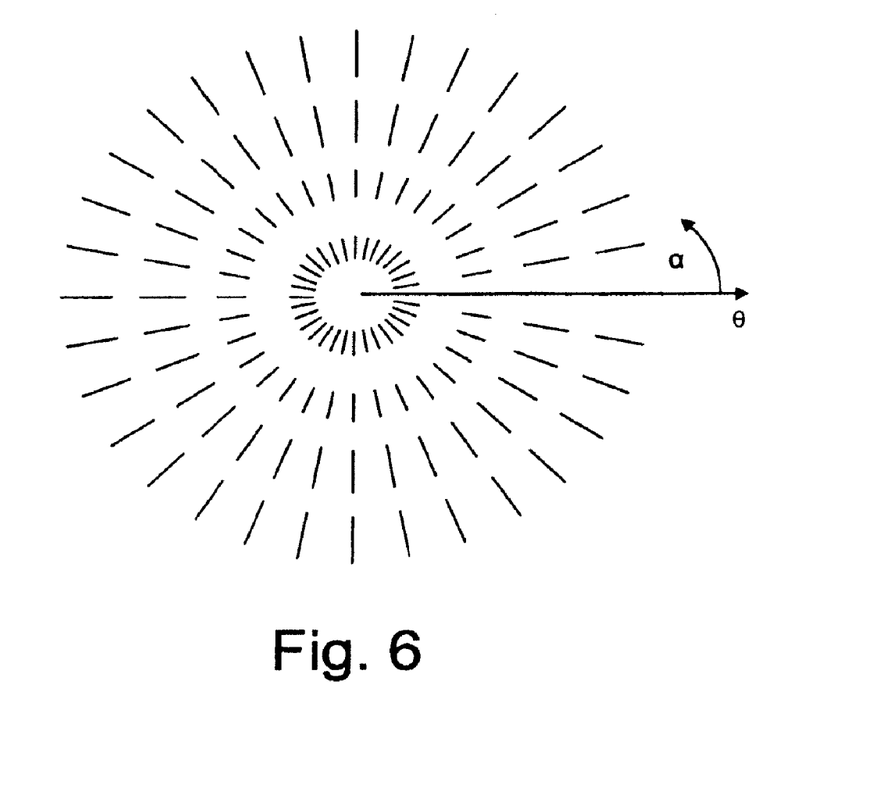
FIG. 6 shows a birefringence direction distribution produced by the uniaxial crystal shown in FIG. 5.

FIG. 6 shows the angle dependent birefringence direction distribution of the layer 34 made of $MgF_2$. The direction of the lines again denotes the direction of the slow birefringence axes. These axes are aligned radially, and since the magnitude of the birefringence does not vary with the azimuth angle $\alpha$, the birefringence direction distribution is again rotationally symmetrical. The magnitude $\Delta n$ of birefringence increases approximately $\Delta n \sim r^2$.

Thus $MgF_2$ has a birefringence direction distribution that is very similar to the distribution which can be achieved with two $CaF_2$ crystals with the [111] crystal axes aligned along the optical axis 26 and a clocking angle of 60° or an odd multiple thereof. The correction element K' may therefore be used instead of [111] crystals if the optical elements composed of quartz glass have, in their entirety, a birefringence direction distribution in which the slow birefringence axis extends in the tangential direction.

If the correction element K' shall compensate retardances caused by quartz glass elements that have, in their entirety, a birefringence direction distribution in which the slow birefringence axis extends in the radial direction, a negatively uniaxial crystal such as $Al_2O_3$ may be used.

The thickness of the layer 34 has to be selected dependent on the retardances caused by the optical elements L1 to L16, 15, 16, 24. In $MgF_2$ the birefringence $\Delta n$ at a wavelength $\lambda$=193 nm is about 0.0136. Consequently, causing a retardance of 5 nm requires a layer thickness d about 370 nm.

Since the correction element K' has an angularly varying birefringence direction distribution, it should be positioned close to a field plane for the same reasons as outlines above in connection with the embodiment shown in the FIGS. 1 to 4. The correction element K' is very thin, and therefore it may easily be positioned immediately in front of the image plane FP or between the two last lenses of the projection lens 10.

The invention claimed is:

1. An optical system of a microlithographic exposure apparatus, comprising:
   a) at least one optical element having a locally varying birefringence direction distribution that is at least substantially rotationally symmetrical; and
   b) two correcting elements each made of an intrinsically birefringent crystal, the intrinsically birefringent crystals having crystal lattices that are oriented such that the combination of correcting elements have a location independent birefringence direction distribution that varies depending on aperture angle in a way that is at least substantially rotationally symmetrical, wherein the birefringent crystals have crystal lattice orientations such that their combined birefringence direction distribution is at least substantially perpendicular to the locally varying birefringence direction distribution of the at least one optical element.

2. The optical system of claim 1, wherein the intrinsically birefringent crystal has a fluorite crystal structure.

3. The optical system of claim 1, wherein the intrinsically birefringent crystal is crystalline $CaF_2$ or $BaF_2$ or $Ca_{1-x}Ba_xF_2$.

4. The optical system of claim 1, wherein the crystal lattices of the correcting elements are oriented such that their crystal axes are aligned substantially parallel to an optical axis of the optical system and are rotated through 45° or an odd multiple thereof relative to one another about the optical axis.

5. The optical system of claim 1, wherein the crystal lattices of the correcting elements are oriented such that their crystal axes are aligned substantially parallel to an optical axis of the optical system and are rotated through 60° or an odd multiple thereof relative to one another about the optical axis.

6. The optical system of claim 1, wherein the correcting elements are positioned adjacent to each other.

7. The optical system of claim 1, wherein both correcting elements have approximately plane surfaces.

8. The optical system of claim 7, wherein the surfaces have normalized curvatures CA/R of less than 1, wherein CA is the clear aperture of the surface and R is the radius.

9. The optical system of claim 8, wherein the surfaces have normalized curvatures of less than 0.7.

10. The optical system of claim 9, wherein the surfaces have normalized curvatures of less than 0.4.

11. The optical system of claim 10, wherein the surfaces have normalized curvatures of less than 0.2.

12. The optical system of claim 1, wherein the crystal is a $MgF_2$ or an $Al_2O_3$ crystal.

13. The optical system of claim 1, wherein at least one the two correcting elements is positioned in or in close proximity to a field plane of the optical system.

14. The optical system of claim 1, wherein one of the two correcting elements is the last optical element of the optical system.

15. The optical system of claim 1, wherein at least one of the two correcting elements is positioned in or in close proximity to a pupil plane of the optical system.

16. The optical system of claim 1, wherein the optical system is a projection lens.

17. A microlithographic exposure apparatus comprising an optical system of claim 1.

18. A method for the production of micro-structured components by microlithography, said method comprising the following steps:
   a) providing a substrate supporting a layer of a light-sensitive material;
   b) providing a reticle containing structures to be imaged onto the layer;
   c) providing a microlithographic exposure apparatus of claim 17;
   d) projecting at least a part of the structures onto a region on the layer using the microlithographic exposure apparatus.

19. A method of manufacturing an optical system of a microlithographic exposure apparatus, said method comprising the steps of:
   a) providing at least one optical element having a locally varying birefringence direction distribution that is at least substantially rotationally symmetrical;
   b) providing two birefringent correcting elements each made of an intrinsically birefringent crystal, the intrinsically birefringent crystals having crystal lattices that are oriented such that the combination of correcting elements have a location independent birefringence direction distribution that varies depending on aperture angle in a way that is at least substantially rotationally symmetrical, wherein the birefringent crystals have crystal lattice orientations that are selected such that their combined birefringence direction distribution is at least substantially perpendicular to the locally varying birefringence direction distribution of the at least one optical element.

20. An optical system of a microlithographic exposure apparatus, comprising:
   a) at least one optical element having a locally varying birefringence direction distribution that is at least substantially rotationally symmetrical; and
   b) at least one birefringent correcting element made of a birefringent uniaxial crystal,
   wherein the birefringent uniaxial crystal:
      has a crystal lattice that is oriented such that the at least one birefringent correcting element has a location independent birefringence direction distribution that varies depending on aperture angle in a way that is at least substantially rotationally symmetrical;
      has a crystal lattice orientation such that the birefringence direction distribution of the at least one birefringent correcting element is at least substantially perpendicular to the locally varying birefringence direction distribution of the at least one optical element;
      has a birefringence axis that is at least substantially aligned along an optical axis of the optical system; and
      is grown as a layer supported on a substrate.

21. The optical system of claim 20, wherein the layer has a thickness of less than 1000 nm.

22. The optical system of claim 21, wherein the layer has a thickness of less than 500 nm.

23. The optical system of claim 22, wherein the layer has a thickness of less than 250 nm.

24. The optical system of claim 20, wherein the layer has a constant thickness.

25. The optical system of claim 20, wherein the substrate is a lens.

26. The optical system of claim 20, wherein the crystal is a $MgF_2$ or an $Al_2O_3$ crystal.

27. A microlithographic exposure apparatus comprising an optical system of claim 20.

28. A method for the production of micro-structured components by microlithography, said method comprising the following steps:
   a) providing a substrate supporting a layer of a light-sensitive material;
   b) providing a reticle containing structures to be imaged onto the layer;
   c) providing a microlithographic exposure apparatus of claim 27;
   d) projecting at least a part of the structures onto a region on the layer using the microlithographic exposure apparatus.

* * * * *

UNITED STATES PATENT AND TRADEMARK OFFICE
CERTIFICATE OF CORRECTION

| | |
|---|---|
| PATENT NO. | : 7,483,121 B2 |
| APPLICATION NO. | : 11/949981 |
| DATED | : January 27, 2009 |
| INVENTOR(S) | : Daniel Kraehmer and Wilhelm Ulrich |

Page 1 of 1

It is certified that error appears in the above-identified patent and that said Letters Patent is hereby corrected as shown below:

Column 4, line 8, delete "correaction" insert --correction--.

Column 7, line 51, delete "correaction" insert --correction--.

Column 9, line 19, Claim 13, delete "one" insert --one of--.

Signed and Sealed this

Twenty-fourth Day of March, 2009

JOHN DOLL
*Acting Director of the United States Patent and Trademark Office*